United States Patent [19]
Brown

[11] Patent Number: 5,524,231
[45] Date of Patent: Jun. 4, 1996

[54] NONVOLATILE MEMORY CARD WITH AN ADDRESS TABLE AND AN ADDRESS TRANSLATION LOGIC FOR MAPPING OUT DEFECTIVE BLOCKS WITHIN THE MEMORY CARD

[75] Inventor: David M. Brown, Fair Oaks, Calif.

[73] Assignee: Intel Corporation, Santa Clara, Calif.

[21] Appl. No.: 86,043

[22] Filed: Jun. 30, 1993

[51] Int. Cl.$^6$ .............. G06F 12/00; G06F 13/00; G11C 16/06

[52] U.S. Cl. .............. 395/428; 395/421.01; 365/52; 365/185.09; 365/185.29; 365/195; 235/380

[58] Field of Search .............. 364/200; 395/400, 395/425, 428, 421.01; 365/52, 185.09, 185.29, 195, 196, 900; 235/380

[56] References Cited

U.S. PATENT DOCUMENTS

| | | | |
|---|---|---|---|
| 4,089,063 | 5/1978 | Takezono et al. | 365/200 |
| 4,566,102 | 1/1986 | Hefner | 371/11 |
| 4,617,479 | 10/1986 | Hartmann et al. | 307/465 |
| 4,644,494 | 2/1987 | Muller | 364/900 |
| 4,654,830 | 3/1987 | Chua et al. | 365/200 |
| 4,758,946 | 7/1988 | Shar et al. | 371/21.6 |
| 4,979,144 | 12/1990 | Mizuta | 364/900 |
| 5,199,033 | 3/1993 | McGeoch et al. | 371/10.1 |
| 5,200,959 | 4/1993 | Gross et al. | 371/21.6 |
| 5,283,790 | 1/1994 | Kawashita | 371/101 |
| 5,386,539 | 1/1995 | Nishi | 395/425 |
| 5,388,248 | 2/1995 | Robinson et al. | 395/425 |
| 5,404,475 | 4/1995 | Fujisono et al. | 395/400 |

Primary Examiner—Tod R. Swann
Assistant Examiner—Tuan V. Thai
Attorney, Agent, or Firm—Blakely, Sokoloff, Taylor & Zafman

[57] ABSTRACT

A nonvolatile memory card includes first memory and a second memory. The first memory includes a first block and a second block, each can be addressed by a first block address and a second block address, respectively. The second memory includes a third block and a fourth block, each can be addressed by a third block address and a fourth block address, respectively. An address table is used for storing (1) each of the first, second, third, and fourth block addresses and (2) a first, a second, a third, and a fourth status data, each indicating the operational condition of one of the first, second, third, and fourth blocks, respectively. Each of the first, second, third, and fourth status data can be in a first state and a second state. When a particular one of the first, second, third, and fourth blocks is non-operational, the corresponding one of the first, second, third, and fourth status data is at the first state. An address translation logic is coupled to (1) the address table and (2) the first and second memories for receiving external addresses to access memory locations within the first and second memories, and for converting the external addresses to access the memory locations in only the operational ones of the first, second, third, and fourth blocks such that the external addresses are consecutive while at least one of the first, second, third, and fourth blocks can be non-operational. Each of the external addresses includes a block address and an address associated with the block address.

13 Claims, 4 Drawing Sheets

FIG. 4

| DEVICE NUMBER | BLOCK NUMBER | GOOD/BAD | EXTERNAL ADDRESS | TRANSLATED DEVICE ADDRESS | TRANSLATED BLOCK ADDRESS |
|---|---|---|---|---|---|
| 0 | 0 | 1 | 0 | 0 | 0 |
| 0 | 1 | 1 | 1 | 0 | 1 |
| 0 | 2 | 0 | 2 | 0 | 3 |
| 0 | 3 | 1 | 3 | 1 | 0 |
| 1 | 0 | 1 | 4 | 1 | 1 |
| 1 | 1 | 1 | 5 | 1 | 3 |
| 1 | 2 | 0 | 6 | 2 | 0 |
| 1 | 3 | 1 | 7 | 2 | 1 |
| 2 | 0 | 1 | 8 | 2 | 2 |
| 2 | 1 | 1 | 9 | 2 | 3 |
| 2 | 2 | 1 | 10 | 3 | 1 |
| 2 | 3 | 0 | 11 | 3 | 2 |
| 3 | 0 | 1 | 12 | 3 | 3 |
| 3 | 1 | 1 | | | |
| 3 | 2 | 1 | | | |
| 3 | 3 | 1 | | | |

1

NONVOLATILE MEMORY CARD WITH AN ADDRESS TABLE AND AN ADDRESS TRANSLATION LOGIC FOR MAPPING OUT DEFECTIVE BLOCKS WITHIN THE MEMORY CARD

FIELD OF THE INVENTION

The present invention pertains to the field of computer memories. More particularly, this invention relates to an electrically erasable and programmable floating gate nonvolatile memory card with interactive address mapping.

BACKGROUND OF THE INVENTION

One type of prior nonvolatile memory is the flash erasable and electrically programmable read-only memory ("flash EPROM"). The flash EPROM can be programmed by a user. Once programmed, the entire contents of the flash EPROM can be erased by electrical erasure. The flash EPROM may then be reprogrammed with new data.

Prior art personal computer systems typically employ removable data storage media. One common prior art removable storage medium is a floppy disk. A relatively new prior art storage medium is an integrated circuit-based memory card ("IC memory card").

Prior an flash EPROMs are nonvolatile and reprogrammable, and this has permitted the flash EPROM technology to be used for removable data storage. One such prior art application is the flash EPROM memory card ("flash memory card"). The flash memory card typically includes a number of flash EPROMs. The flash memory card can be erased and programmed electrically.

One type of prior flash EPROM used in the prior flash memory card typically includes redundant memory cells and CAM cells in addition to a main memory array. The redundant memory cells are used to replace defective cells of the main memory array. The redundant memory cells are also arranged into rows and columns and are therefore referred to as redundant memory array. When a memory cell in a column of the main memory array is of a prior flash EPROM found defective, a redundant column of the redundant memory array is used to replace the defective column in the main memory array.

The CAM cells are typically used to activate the redundant memory array to replace defective columns of the main memory array. The CAM cells typically comprise flash EPROM cells.

Disadvantages are, however, associated with the prior flash EPROM used in the prior flash memory card. One disadvantage is that when one prior flash EPROM has more defective cells than the redundant memory cells or the defective cells cannot be replaced by the redundant memory cells, this particular prior flash EPROM then cannot be used and has to be rejected. This typically causes the overall manufacture cost of the prior flash EPROM to rise significantly. Moreover, it is typically a waste to discard the entire flash EPROM because of a few defective memory cells within the memory array. This is typically the case when the storage capacity of the prior flash EPROM increases. Typically, the memory cells other than the defective memory cells of a flash EPROM can still be accessed for data storage.

Another disadvantage is that if the prior flash EPROM having unreplaced defective cells is used, the memory locations associated with these defective cells cannot be used and the addresses of those defective memory locations have to be taken out from the address map of the flash EPROM. This typically causes the address map for the flash EPROM to be non consecutive. When such a flash EPROM is used in a prior flash memory card, the addresses of those defective memory locations will also cause the card address map to be non consecutive. In addition, the external circuitry accessing the flash memory card needs to know those defective addresses prior to accessing the flash memory card.

SUMMARY AND OBJECTS OF THE INVENTION

One of the objects of the present invention is to provide a reprogrammable nonvolatile memory card that uses partially functional reprogrammable nonvolatile memories.

Another object of the present invention is to provide a reprogrammable nonvolatile memory card that uses partially functional reprogrammable nonvolatile memories yet has consecutive card addresses.

Another object of the present invention is to provide a reprogrammable nonvolatile memory card that can map out the non-functional portions in each of the memories of the memory card.

A further object of the present invention is to provide a reprogrammable nonvolatile memory card that is cost effective.

A nonvolatile memory card includes a first memory and a second memory. The first memory includes a first block and a second block, each can be addressed by a first block address and a second block address, respectively. The second memory includes a third block and a fourth block, each can be addressed by a third block address and a fourth block address, respectively. An address table is used for storing (1) each of the first, second, third, and fourth block addresses and (2) a first, a second, a third, and a fourth status data, each indicating the operational condition of one of the first, second, third, and fourth blocks, respectively. Each of the first, second, third, and fourth status data can be in a first state and a second state. When a particular one of the first, second, third, and fourth blocks is non-operational, the corresponding one of the first, second, third, and fourth status data is at the first state. An address translation logic is coupled to (1) the address table and (2) the first and second memories for receiving external addresses to access memory locations within the first and second memories, and for converting the external addresses to access the memory locations in only the operational ones of the first, second, third, and fourth blocks such that the external addresses are consecutive while at least one of the first, second, third, and fourth blocks can be non-operational. Each of the external addresses includes a block address and an address associated with the block address.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 4 is a table showing the function of the address table and the address translation logic.

DETAILED DESCRIPTION

Figure 1:
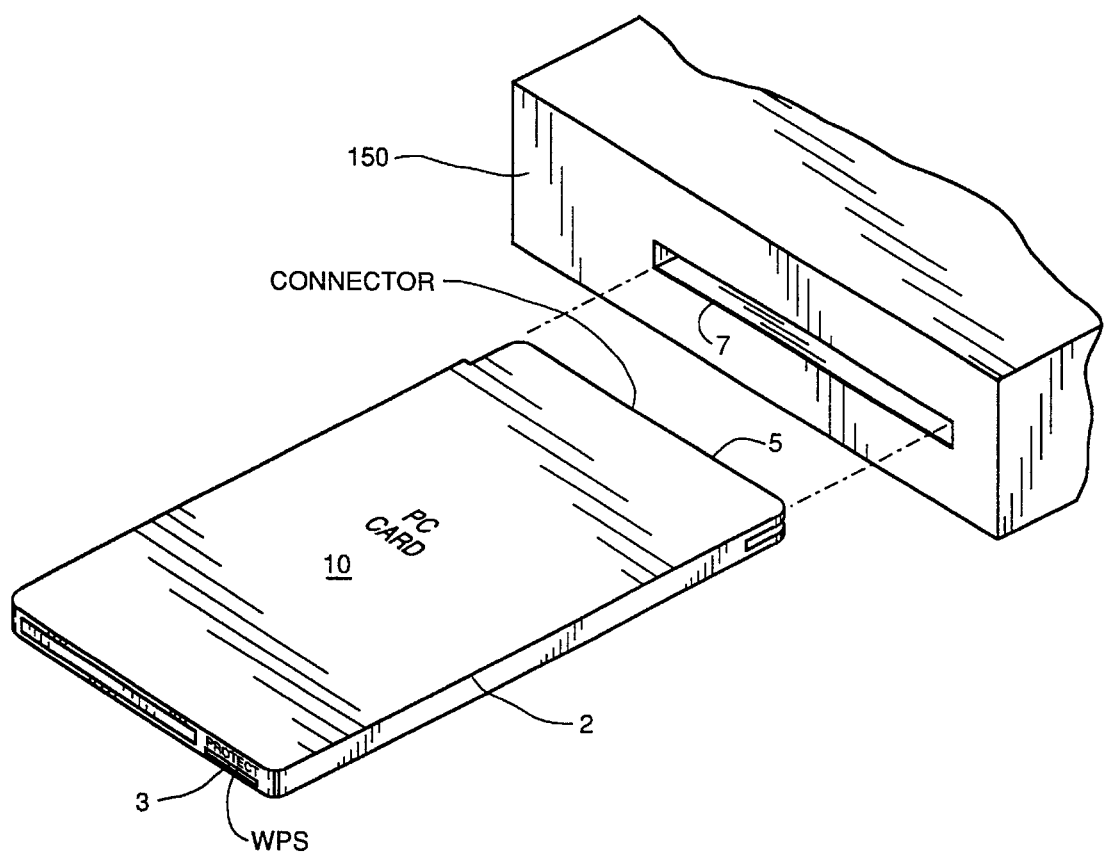
FIG. 1 is a perspective view of a flash memory card.

FIG. 1 is a perspective view of a flash memory card 10. Inside plastic case 2 of flash memory card 10 there are a plurality of flash EPROMs (not shown in FIG. 1) for storing data at addresses. Flash memory card 10 is inserted to a slot 7 of a personal computer 150 for a memory read or write operation.

Card 10 includes connector 5 located on one side of card 10 to connect card 10 to personal computer 150 when the connector 5 is inserted into slot 7. Card 10 also includes a write protect switch ("WPS") 3.

Computer 150 can be a portable computer, a laptop computer, a desk-top computer, a workstation, a mini computer, a mainframe, or any other type of computer. Computer 150 includes a central processing unit, a memory, and other peripheral devices (all are not shown).

Figure 2:
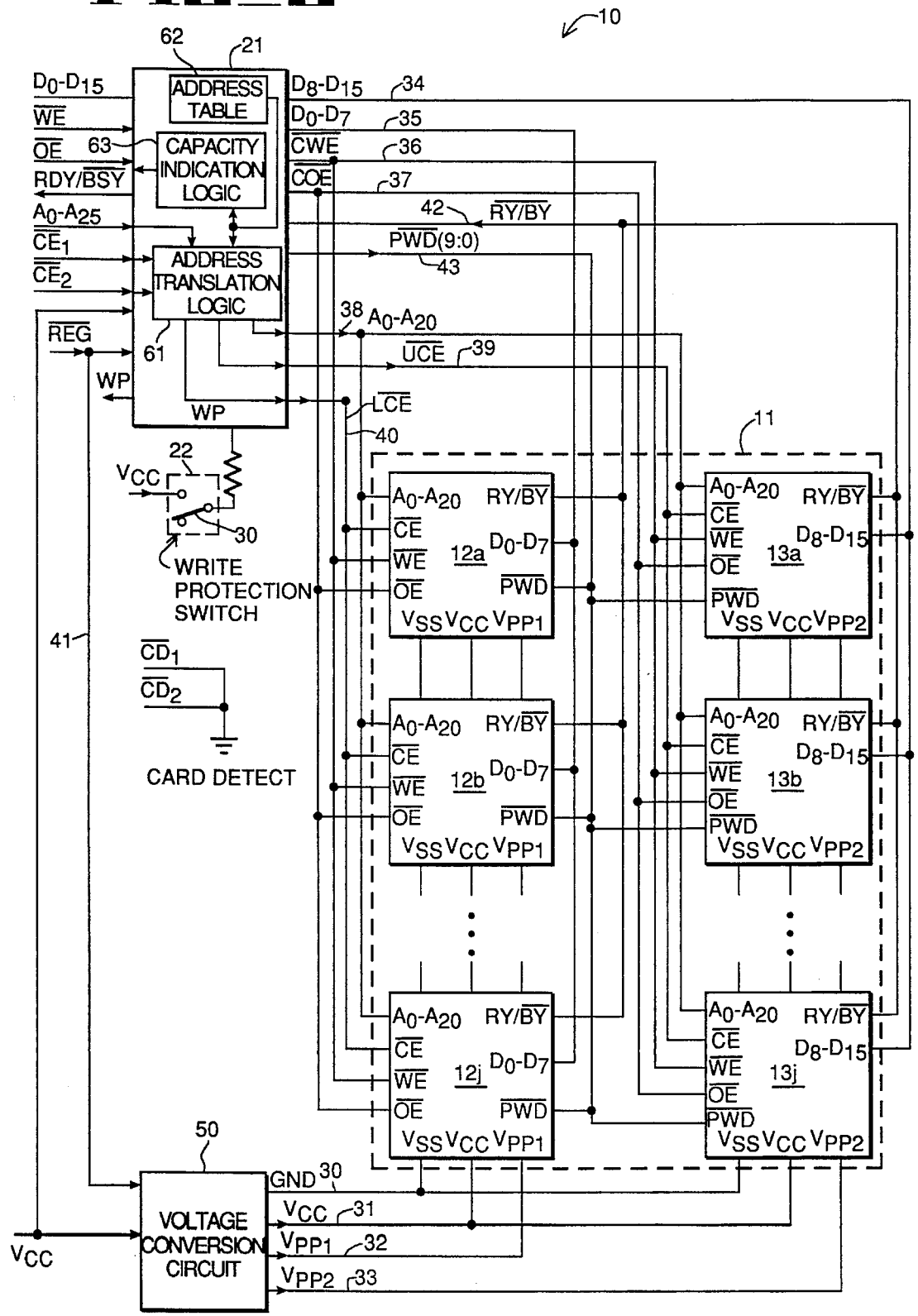
FIG. 2 is a block diagram of the flash memory card, which includes a plurality of flash EPROMs, an address table, a storage indication logic, and an address translation logic.

FIG. 2 is a block diagram of flash memory card 10. Flash memory card 10 includes a memory array 11 that includes a plurality of flash EPROMs 12a through 12j and 13a through 13j, each of which includes memory cells that store data at addresses. For one embodiment, memory array 11 includes twenty flash EPROMs.

For other embodiments, memory array 11 may include more or fewer than twenty flash EPROMs. For example, memory array 11 may include two to eighteen flash EPROMs.

For one embodiment, flash memory card 10 can store 40 megabytes ("Mbytes") of data.

For one embodiment, each of flash EPROMs 12a–12j and 13a–13j can store 16 Mbits (i.e., megabits) of data. For other embodiments, each of flash EPROMs 12a–12j and 13a–13j of memory array 11 stores more or fewer than 16 Mbits of data.

Each of flash EPROMs 12a–12j and 13a–13j within memory array 11 includes address inputs $A_0$ through $A_{20}$ and data pins $D_0$ through $D_7$ or $D_8$ through $D_{15}$. Addresses are latched into each of flash EPROMs 12a–12j and 13a–13j via respective address inputs $A_0$ through $A_{20}$. Each of flash EPROMs 12a–12j includes data pins $D_0$ through $D_7$ and each of flash EPROMs 13a–13j includes data pins $D_8$ through $D_{15}$.

Each of the plurality of blocks can be individually addressed for read, programming, and erasure operations.

Each of flash EPROMs 12a–12j and 13a–13j includes a memory array that is organized into a plurality of blocks (not shown in FIG. 2). The plurality of blocks are bit line blocks, for one embodiment. Each block includes a plurality of bit lines. The bit lines of a block are thus construed to extend only within that block and are not connected to any cells in its adjacent blocks. The memory array also includes a plurality of word lines that are shared by and are common to all the blocks. Memory cells are arranged at the intersections of the bit lines and word lines.

For one embodiment, each of flash EPROMs 12a–12j and 13a–13j includes 32 blocks, each storing 512 Kbits (i.e., Kilobits) of data. For alternative embodiments, each of flash EPROMs 12a–12j and 13a–13j may include more or fewer than 32 blocks.

When an address is applied to a particular one of flash EPROMs 12a–12j and 13a–13j, a memory location within one of the plurality of blocks will be addressed. The address applied will select one word line and a byte of (i.e., eight) bit lines within the selected block. When one or more memory locations within that particular block are found defective, the entire block will be treated as a defective block and will not be used to store data.

The defective block or blocks within each of flash EPROMs 12a–12j and 13a–13j can be detected during testing of each of flash EPROMs 12a–12j and 13a–13j or when each of flash EPROMs 12a–12j and 13a–13j has been placed in flash memory card 10. Any known software method can be used to detect the defective blocks in each of flash EPROMs 12a–12j and 13a–13j by accessing each memory location in each of flash EPROMs 12a–12j and 13a–13j. The information with respect to the defective blocks in each of flash EPROMs 12a–12j and 13a–13j is then stored in an address table 62 of a card control logic 21 of the flash memory card 10. Card control logic 21 and address table 62 will be described in more detail below. The information stored in address table 62 includes all the addresses of the defective blocks of flash EPROMs 12a–12j and 13a–13j. The information in address table 62 can then be used to map out the defective blocks in each of flash EPROMs 12a–12j and 13a–13j, which will also be described in more detail below.

Each of flash EPROMs 12a–12j and 13a–13j includes a write enable input pin $\overline{WE}$, an output enable input pin $\overline{OE}$, and a chip enable input pin $\overline{CE}$. The $\overline{WE}$, $\overline{OE}$, and $\overline{CE}$ inputs are each active low. Chip enable $\overline{CE}$ is the chip select for each of flash EPROMs 12a–12j and 13a–13j and is used for device selection. Output enable $\overline{OE}$ is the output control for each of flash EPROMs 12a–12j and 13a–13j and is used to gate data from data pins $D_0$–$D_7$ or $D_8$–$D_{15}$.

A logical low $\overline{WE}$ input to a particular flash EPROM of flash EPROMs 11 allows that flash EPROM to be written to if the $\overline{CE}$ input for that flash EPROM is logically low. Addresses are latched on the falling edge of a write enable pulse. Data is latched on the rising edge of a write enable pulse.

Each of flash EPROMs 12a–12j and 13a–13j also includes a program/erase power supply voltage input $V_{PP1}$ or $V_{PP2}$, a device power supply input $V_{CC}$, and a $V_{SS}$ input. $V_{PP1}$ is the program/erase power supply for flash EPROMs 12a–12j and $V_{PP2}$ is the program/erase power supply for flash EPROMs 13a–13j. For one embodiment, flash EPROMs 11 require $V_{PP1}$ and $V_{PP2}$ each to be approximately 12.0 volts. For one embodiment, flash EPROMs 11 require $V_{CC}$ to be approximately 5.0 volts or 3.0 volts. $V_{SS}$ is ground.

In absence of a high (i.e., 12 volts) $V_{PP1}$ or $VPP_2$ voltage applied to a respective one of flash EPROMs 12a–12j and 13a–13j, the flash EPROM acts as a read-only memory. The data stored at an address supplied via the $A_0$–$A_{20}$ address inputs is read from its memory cell array and made available through its data pins $D_0$–$D_7$ or $D_8$–$D_{15}$.

When a 12 volt $V_{PP1}$ or $V_{PP2}$ voltage is supplied to a respective flash EPROM of flash EPROMs 11, the contents of that flash EPROM can be erased by an erasure operation and the device may then be reprogrammed with new data and codes via a program operation. Each of flash EPROMs 12a–12j and 13a–13j includes circuitry that performs the erasure and programming operations.

Each of flash EPROMs 12a–12j and 13a–13j also includes a power down pin $\overline{PWD}$. Power down pin $\overline{PWD}$ for a flash EPROM is the power down mode control. When the power down $\overline{PWD}$ signal at one of flash EPROMs 12a–12j and 13a–13j is at logical low level, that flash EPROM enters the power down mode.

Each of flash EPROMs 12a–12j and 13a–13j also includes a ready/busy output pin RY/$\overline{BY}$. Ready/busy RY/$\overline{BY}$ is the ready/busy indicator of each of flash EPROMs 12a–12j and 13a–13j. The RY/$\overline{BY}$ output of each of flash EPROMs 12a–12j and 13a–13j is active low. A logically high RY/$\overline{BY}$ output of a flash EPROM indicates a "ready" condition or mode for the flash EPROM (i.e., ready to accept an operation). A logically low RY/$\overline{BY}$ output indicates a "busy" condition or mode for the flash EPROM (i.e., the write state circuitry is presently busy).

Flash memory card 10 further includes card control logic 21. Card control logic 21 interfaces between card pins of flash memory card 10 and flash EPROMs 11. Card control logic 21 includes data control circuit (not shown) for routing data to and from flash memory card 10, card information structure (not shown) for storing information describing the structure of flash memory card 10, and card control registers (also not shown) for controlling and reporting status with respect to flash memory card 10.

Card control logic 21 provides control logic for flash memory card 10. Card control logic 21 receives addresses, data, control signals, power and ground. Card control logic 21 in turn (1) oversees reading, erasing, and programming with respect to flash EPROMs 12a–12j and 13a–13j, (2) oversees the use of electrical power within flash memory card 10, (3) oversees the sending out to the external host computer (not shown) card information structure data with respect to flash memory card 10, and (4) oversees the sending out to the host computer status information regarding flash memory card 10.

Card control logic 21 also includes address table 62, a capacity indication logic 63, an address translation logic 61. As described above, address table 62 stores the block address of each of the plurality of blocks in each of flash EPROMs 12a–12j and 13a–13j and the status information of the respective block, indicating whether the block is a defective block or a non-defective block. Both capacity indication logic 63 and address translation logic 61 are coupled to address table 62.

Address table 62 can be formed by a nonvolatile memory or a volatile memory. For one embodiment, address table 62 is formed by ROM cells. For another embodiment, address table 62 is formed by flash EPROM cells.

Address table 62 stores the block address and the status information of each block within each of flash EPROMs 12a–12j and 13a–13j. The block address indicates the address of a block of one of flash EPROMs 12a–12j and 13a–13j in memory array 11. The block addresses are linearly mapped in memory array 11. The status information indicates whether the block is a non-detective block or a defective block. The block address and the status information for each block of each of flash EPROMs 12a–12j and 13a–13j are stored in address table 62 in a look-up table format. The function of address table 62 will be described in more detail below, also in conjunction with FIGS. 3–4. Capacity indication logic 63 is used to report to the external host computer the total storage capacity (i.e., the total number of non-defective blocks) of flash memory card 10. For example, when each of flash EPROMs 12a–12j and 13a–13j has 32 blocks, each storing 512 Kbits of data, then capacity indication logic 63 will indicate to the external host computer that the total storage capacity of flash memory card 10 is 36 Mbytes when there are 8 defective blocks among flash EPROMs 12a–12j and 13a–13j. This causes the external host computer to treat flash memory card 10 as a 36 Mbyte flash memory card.

When there are 10 defective blocks among flash EPROMs 12a–12j and 13a–13j, then capacity indication logic 63 will indicate to the external host computer that the total storage capacity of flash memory card 10 is 35 Mbytes. In this situation, the external host computer will treat flash memory card 10 as a 35 Mbyte flash memory card.

Capacity indication logic 63 can be any known logic circuit. For example, capacity indication logic 63 can be a counter that counts the number of total non-defective blocks from the status information of address table 62. As a further example, capacity indication logic 63 can be a sum logic that sums up all the non-defective block status data in address table 62. The output of capacity indication logic 63 is supplied to the external host computer via card data pins $D_0$ through $D_{15}$, which will be described below.

Address translation logic 61 is used in card control logic 21 to provide the necessary logic (1) to decode the individual chip enable $\overline{CE}$ signals needed internally for flash memory card 10 to select among flash EPROMs 12a–12j and 13a–13j, and (2) to decode and convert the consecutive external card addresses applied to flash memory card 10 from the eternal host computer to internal memory addresses in order to address memory locations in only the non-defective blocks of flash EPROMs 12a–12j and 13a–13j.

The external card addresses are consecutive and can logically consecutively address flash memory card 10. For example, when flash memory card 10 has 35 Mbytes of non-defective storage, the external card addresses applied to card 10 will consecutively address the first 35 Megabyte memory locations of flash memory card 10, regardless of the locations of the defective blocks in flash memory card 10. In other words, the external card addresses do not need to concern about accessing the defective blocks in flash memory card 10 and can therefore be consecutive.

Address translation logic 61 receives the external card addresses via address pins $A_0$ through $A_{25}$ of flash memory card 10 and $\overline{CE}_1$ and $\overline{CE}_2$ card enable signals from $\overline{CE}_1$ and $\overline{CE}_2$ pins of flash memory card 10. Address translation logic 61 then translates or converts the external card addresses into the internal memory addresses for addressing the actual memory locations in the non-defective blocks of flash EPROMs 12a–12j and 13a–13j in accordance with the status information stored in address table 62 such that all the memory locations in defective blocks of flash EPROMs 12a–12j and 13a–13j are blocked out from being accessed by the external consecutive card addresses.

The function of address translation logic 61 is to block out the defective blocks from the card address map of flash memory card 10 such that accessing to those defective blocks is not possible and the external card addresses can be consecutive. Address translation logic 61 performs logic synthesis with respect to the applied card addresses and the status information stored in address table 62 to generate the physical memory addresses for flash EPROMs 12a–12j and 13a–13j. In one word, address translation logic 61 is realized by supplying the information in address table 62 into a logic synthesis program to create an appropriate address translation for flash memory card 10 that prevents accessing to the defective blocks in flash memory card 10.

For one embodiment, address translation logic 61 is implemented by a logic synthesis program. For another embodiment, address translation logic 61 is implemented by a programmable logic gate array. For alternative embodiments, address translation logic 61 can be implemented by other known logic circuits. Functionally speaking, address translation logic 61 directs the external card address that addresses a memory location in a defective block to the corresponding memory location of the adjacent non-defective block. FIG. 4 illustrates the function at address translation logic 61, which will be described in more detail below.

Flash memory card 10 includes data pins $D_0$ through $D_{15}$. Data pins $D_0$–$D_{15}$ are coupled to card control logic 21. Data pins $D_0$–$D_{15}$ are employed to input data during memory write cycles, and to output data during memory read cycles. Data pins $D_0$–$D_{15}$ are active high and float to tri-state OFF when card 10 is deselected or the outputs are disabled.

Flash memory card 10 receives card enable inputs $\overline{CE}_1$ and $\overline{CE}_2$ and output enable input $\overline{OE}$. Card enables $\overline{CE}_1$ and $\overline{CE}_2$ are chip selects that are used for selecting flash EPROMs 12a–12j and 13a–13j. Output enable $\overline{OE}$ is the output control of the card and is used to gate data from $D_0$–$D_{15}$ pins independent of accessed flash EPROM selection. The $\overline{OE}$ signal is processed by card control logic 21 to become the $\overline{COE}$ signal. The $\overline{COE}$ signal is coupled to the $\overline{OE}$ pin of each of flash EPROM 12a–12j and 13a–13j via line 37. When the $\overline{COE}$ is at logical high level, the outputs from all flash EPROMs 12a–12j and 13a–13j are disabled. Data pins $D_0$–$D_{15}$ of the card are placed in a high impedance state.

Card enable $\overline{CE}_1$ and $\overline{CE}_2$ are used to enable flash EPROMs 12a–12j and 13a–13j. When both $\overline{CE}_1$ and $\overline{CE}_2$ are at a logical high level, the card is deselected and the power consumption is reduced to standby level.

Flash memory card 10 also includes a card write enable pin $\overline{WE}$. The card write enable $\overline{WE}$ controls writes to card control logic 21 and flash EPROMs 12a–12j and 13a–13j. When the card $\overline{WE}$ is at logical high level, data input to flash memory card 10 is disabled. The $\overline{WE}$ signal is processed by card control logic 21 to become a $\overline{CWE}$ signal which is coupled to the $\overline{WE}$ input of each of flash EPROMs 12a–12j and 13a–13j via line 36.

Flash memory card 10 also includes a card ready/busy output pin $RDY/\overline{BSY}$. The card ready/busy $RDY/\overline{BSY}$ output indicates whether the card is busy or ready. Card control logic 21 receives the $RY/\overline{BY}$ output from each of flash EPROMs 12a–12j and 13a–13j via line 42 and then outputs the card ready/busy output $RDY/\overline{BSY}$ to the external circuitry host computer.

Flash memory card 10 includes an active low register memory select input pin $\overline{REG}$. The $\overline{REG}$ signal, when logically low, allows card control logic 21 to output the card information structure data from the card information structure of card control logic 21 to the external host computer. In addition, when the $\overline{REG}$ signal is logically low, the card information structure data stored in the card information structure of card control logic 21 can be updated by a write operation to card control logic 21. Moreover, the logical low $\overline{REG}$ signal also allows access to the card control registers of card control logic 21. In other words, the $\overline{REG}$ pin controls the operation to either flash EPROMs 12a–12j and 13a–13j or card control logic 21.

In one embodiment, when the $\overline{REG}$ pin is at low level, the operation is directed to card control logic 21. When the $\overline{REG}$ pin is at high level, the operation is directed to flash EPROMs 12a–12j and 13a–13j.

Flash memory card 10 includes two card detection pins $\overline{CD}_1$ and $\overline{CD}_2$. The card detection pins $\overline{CD}_1$ and $\overline{CD}_2$ allow the host computer system to determine if card 10 is properly loaded.

Flash memory card 10 includes a write protection switch 22. Switch 22 disables circuitry (not shown) in card control logic 21 that controls the write enable signal $\overline{WE}$ to flash EPROMs 12a–12j and 13a–13j. When switch 22 is activated (i.e., a switch knife 30 is connected to the $V_{CC}$), the $\overline{WE}$ output of card control logic 21 is forced high, thus preventing any writes to each of flash EPROMs 12a–12j and 13a–13j.

Flash memory card 10 also includes a write protection output pin WP. When the WP pin is at active high voltage all write operations to the card are disabled. The WP pin reflects the condition of write protect switch 22.

$V_{CC}$ is the card power supply for flash memory card 10 and GND is ground for the card. For one embodiment, card power supply $V_{CC}$ of flash memory card 10 is 3 volts. For another embodiment, card power supply $V_{CC}$ of flash memory card 10 is 5 volts.

The device power supply $V_{CC}$ is coupled to a voltage conversion circuit 50. Voltage conversion circuit 50 also receives the $\overline{REG}$ signal via line 41. Voltage conversion circuit 50 applies the $V_{CC}$ voltage to each of flash EPROMs 12a–12j and 13a–13j. Voltage conversion circuit 50 generates and applies the program/erase voltage $V_{PP}$ to each of flash EPROMs 12a–12j and 13a–13j.

In another embodiment, flash memory card 10 does not include voltage conversion circuit 50. When this occurs, the external host computer needs to supply the device power supply voltage $V_{CC}$ and the program/erase voltage $V_{PP}$, respectively, to flash memory card 10.

Figure 3:
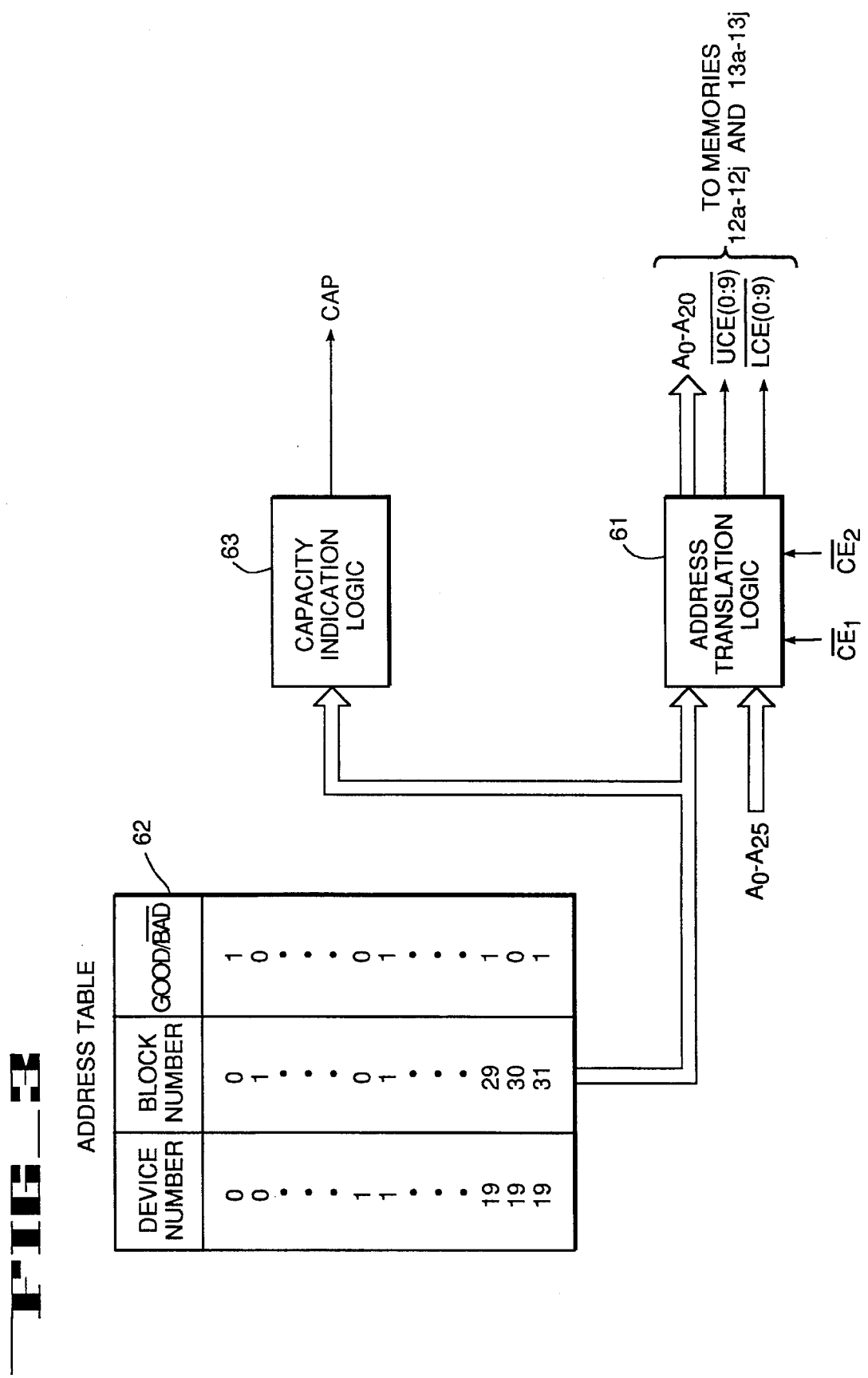
FIG. 3 is a block diagram of the address table, the storage indication logic, and the address translation logic.

Referring now to FIGS. 2–3, the scheme of blocking out the defective blocks from the card memory address map is described below. FIG. 3 illustrates in block diagram form the connection of address table 62, capacity indication logic 63, and address translation logic 61.

During operation, the status information with respect to each block of each of flash EPRO Ms 12a–12j and 13a–13j is stored in address table 62 in a look-up table format. A logical one is used to indicate a non-defective block and a logical zero is used to indicate a defective block. The status information of flash memory card 10 in address table 62 is then supplied to capacity indication logic 63 and address translation logic 61.

Capacity indication logic 63 calculates the total number of non-defective blocks of flash memory card 10 from the status information in address table 62 and outputs a capacity indication signal CAP to the external host computer, indicating the total non-defective storage of flash memory card 10. The CAP signal is applied to the external host computer via data pins $D_0$–$D_{15}$.

Once the information with respect to the total storage of flash memory card 10 is made available to the external host computer, the external host computer can apply a set of consecutive addresses to address the non-defective blocks in flash memory card 10. The number of the external card addresses corresponds to the total number of memory locations in all of the non-defective blocks. The addresses are applied to address translation logic 61 via address pins $A_0$–$A_{25}$.

Address translation logic 61 also receives the $\overline{CD}_1$ and $\overline{CD}_2$ inputs. Address translation logic 61 outputs the translated memory addresses to flash EPROMs 12a–12j and 13a–13j via address bus 38. Address translation logic 61 also outputs the $\overline{UCE}$ signal and $\overline{LCE}$ signal to flash EPROMs 12a–12j and 12a–13j via lines 39 and 40. The address translation function of address translation logic 61 is described as follows.

When an external card address is applied to address translation logic 61 via address pins $A_0$–$A_{25}$, address translation logic 61 first determines the block address of that external card address within memory array 11. Address translation logic 61 then checks the status information in address table 62 to determine the number of defective blocks each of which has a block address less than or equal to that of the particular external card address in memory array 11. Address translation logic 61 then adds this number to the block address of the external card address such that the converted block address is directed to a different block. Address translation logic 61 then checks address table 62 to determine if the converted block address is still directed to a defective block. If so, the converted block address is again increased to an adjacent non-defective block. If the converted block address is directed to the last block of a flash EPROM, then address translation logic 61 increases the converted block address to an adjacent non-defective block at next memory.

FIG. 4 illustrates an example of mapping out the defective blocks of flash memory card 10 of FIG. 2. In FIG. 4, for illustration purposes only, only four flash EPROMs 0 through 3, each having four blocks 0 through 3 are used. Block 2 of flash EPROM 0 is a defective block, block 2 of flash EPROM 1 is a defective block, and block 0 of flash EPROM 3 is a defective block. Therefore, flash memory card 10 has a total of 13 non-defective blocks and the external card addresses for those non-defective blocks range consecutively from 0 to 12, as shown in FIG. 4. With address translation logic 61, defective blocks (0,2) (i,e., memory number, block number), (1,2), and (3,0) will not be accessed by the external consecutive card addresses. As shown in FIG. 4, when external address 2 is received, address translation logic 61 converts that address into device address 0 and block address 3. When external address 5 is received, address translation logic 61 converts that address into device address 1 and block address 3. When external address 10 is received, address translation logic 61 converts that address into device address 3 and block address 1. In this way, the defective blocks within flash memory card 10 are blocked out from the card address map while the external card addresses are still consecutive. Moreover, by doing so, any partially defective flash EPROM with non-defective storage blocks can be used to form a flash memory card.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A nonvolatile memory card, comprising:

(A) a first memory and a second memory, wherein the first memory includes a first block and a second block, each being addressed by a first block address and a second block address, respectively, wherein the second memory includes a third block and a fourth block, each being addressed by a third block address and a fourth block address, respectively;

(B) an address table stored in an electrically erasable and programmable read-only memory separate from the first and second memories for storing (1) each of the first, second, third, and fourth block addresses and (2) a first, a second, a third, and a fourth status data, each indicating an operational condition of one of the first, second, third, and fourth blocks, respectively, wherein each of the first, second, third, and fourth status data can be in a first state and a second state, wherein when a particular one of the first, second, third, and fourth blocks is non-operational, the corresponding one of the first, second, third, and fourth status data is at the first state;

(C) a set of program instructions for translating external addresses received from an external circuitry into memory addresses that access memory locations in only the operational ones of the first, second, third, and fourth blocks in accordance with the status data of the first, second, third, and fourth block stored in the address table such that the external addresses are consecutive while at least one of the first, second, third, and fourth blocks can be non-operational, wherein each of the external addresses includes a block address and an address associated with the block address.

2. The memory card of claim 1, further comprising a capacity indication logic coupled to the address table for calculating a total number of operational blocks among the first, second, third, and fourth blocks and for indicating to the external circuitry the total number of operational blocks of the memory card.

3. The memory card of claim 2, wherein the external addresses include a number of external block addresses corresponding only to a total number of operational blocks of the first and second memories, wherein the external block addresses are consecutive.

4. The memory card of claim 3, wherein when the external circuitry applies an external address to the memory card that includes a first external block address and when the first block is non-operational and the second block is operational, the address translation logic converts the first external block address of the external address into the second block address, wherein when the external circuitry applies an external address to the memory card that includes a second external block address and when the first block is non-operational and the second and third blocks are operational, the address translation logic converts the second external block address of the external address into the third block address.

5. The memory card of claim 1, wherein the first memory includes a first plurality of blocks, including the first and second blocks, wherein the second memory includes a second plurality of blocks, including the third and fourth blocks, wherein each of the first and second plurality of blocks includes a plurality of memory locations.

6. The memory card of claim 5, wherein the address table stores block addresses of each of the first and second plurality of blocks and the status data of an operational condition of each of the first and second plurality of blocks, respectively.

7. The memory card of claim 1, wherein each of the first and second memories is an electrically programmable and electrically erasable read-only memory.

8. A nonvolatile memory card, comprising:

(A) a first memory and a second memory, wherein the first memory includes a first block and a second block, each being addressed by a first block address and a second block address, respectively, wherein the second memory includes a third block and a fourth block, each being addressed by a third block address and a fourth block address, respectively;

(B) an address table stored in an electrically erasable and programmable read-only memory separate from the first and second memories for storing (1) each of the first, second, third, and fourth block addresses and (2) a first, a second, a third, and a fourth status data, each indicating an operational condition of one of the first, second, third, and the fourth blocks, respectively, wherein each of the first, second, third, fourth status data can be in a first state and a second state, wherein when a particular one of the first, second, third, and fourth blocks is non-operational, the corresponding one of the first, second, third, and fourth status data is at the first state;

(C) a set of program instructions for translating external address received for external circuitry to memory addresses that access memory locations in only the operational ones of the first, second, third, and fourth blocks in accordance with the status data of the first, second, third, and fourth blocks stored in the address table such that the external addresses are consecutive while at least one of the first, second, third, and fourth blocks can be non-operational, wherein each of the external addresses includes a block address and an address associated with the block address; and (D) a capacity indication logic coupled to the address table for calculating a total number of operational blocks of the first, second, third, and fourth blocks and for indicating to the external circuitry the total number of operational blocks of the memory card.

9. The memory card of claim 8, wherein the external addresses include a number of external block addresses corresponding only to a total number of operational blocks of the first and second memories, wherein the external block addresses are consecutive.

10. The memory card of claim 9, wherein when the external circuitry applies an external address to the memory card that includes a first external block address and when the first block is non-operational and the second block is operational, the address translation logic converts the first external block address of the external address into the second block address, wherein when the external circuitry applies an external address to the memory card that includes a second external block address and when the first block is non-operational and the second and third blocks are operational, the address translation logic converts the second external block address of the external address into the third block address.

11. The memory card of claim 8, wherein the first memory includes a first plurality of blocks, including the first and second blocks, wherein the second memory includes a second plurality of blocks, including the third and fourth blocks, wherein each of the first and second plurality of blocks includes a plurality of memory locations.

12. The memory card of claim 11, wherein the address table stores block addresses of each of the first and second plurality of blocks and the status data of an operational condition of each of the first and second plurality of blocks, respectively.

13. The memory card of claim 8, wherein each of the first and second memories is an electrically programmable and electrically erasable read-only memory.

\* \* \* \* \*

UNITED STATES PATENT AND TRADEMARK OFFICE
CERTIFICATE OF CORRECTION

| | | |
|---|---|---|
| PATENT NO. | : | 5,524,231 |
| DATED | : | June 4, 1996 |
| INVENTOR(S) | : | David M. Brown |

It is certified that error appears in the above-identified patent and that said Letters Patent is hereby corrected as shown below:

In column 1 at line 27 delete "an" and insert --art--

In column 6 at line 28 delete "eternal" and insert --external--

In column 10 at line 17 delete "block" and insert --blocks--

In column 11 at line 15 delete "address" and insert --addresses--

In column 11 at line 15 delete "for" and insert --from an--

Signed and Sealed this

First Day of July, 1997

*Attest:*

*Attesting Officer*

BRUCE LEHMAN

*Commissioner of Patents and Trademarks*